(12) United States Patent
Christian et al.

(10) Patent No.: US 11,001,047 B2
(45) Date of Patent: May 11, 2021

(54) METHODS FOR ADDITIVELY MANUFACTURED IDENTIFICATION FEATURES

(71) Applicant: DIVERGENT TECHNOLOGIES, INC., Los Angeles, CA (US)

(72) Inventors: Donald J. Christian, Los Angeles, CA (US); John Russell Bucknell, Los Angeles, CA (US)

(73) Assignee: Divergent Technologies, Inc., Los Angeles, CA (US)

( * ) Notice: Subject to any disclaimer, the term of this patent is extended or adjusted under 35 U.S.C. 154(b) by 0 days.

(21) Appl. No.: 16/449,216

(22) Filed: Jun. 21, 2019

(65) Prior Publication Data

US 2019/0315116 A1 Oct. 17, 2019

Related U.S. Application Data

(62) Division of application No. 15/677,734, filed on Aug. 15, 2017, now Pat. No. 10,357,959.

(51) Int. Cl.
*B05D 1/00* (2006.01)
*B29C 41/22* (2006.01)
(Continued)

(52) U.S. Cl.
CPC ............ *B33Y 50/02* (2014.12); *B29C 64/118* (2017.08); *B29C 64/153* (2017.08);
(Continued)

(58) Field of Classification Search
CPC .. B05D 1/00; B22F 3/1055; B22F 2003/1057; B29C 41/22; B29C 64/118; B29C 64/153; B29C 64/386; B29C 64/393; B29C 67/0007; B29C 69/001; B29C 2793/0009; B29C 2793/009; B29C 2795/007; B29K 2995/002;
(Continued)

(56) References Cited

U.S. PATENT DOCUMENTS 5,203,226 A 4/1993 Hongou et al.
5,742,385 A 4/1998 Champa
(Continued)

FOREIGN PATENT DOCUMENTS

JP 2015082678 A * 4/2015 ............ G06K 19/06
WO 1996036455 A1 11/1996
(Continued)

OTHER PUBLICATIONS

US 9,202,136 B2, 12/2015, Schmidt et al. (withdrawn)
US 9,809,265 B2, 11/2017, Kinjo (withdrawn)
US 10,449,880 B2, 10/2019, Mizobata et al. (withdrawn)

*Primary Examiner* — Leo B Tentoni
(74) *Attorney, Agent, or Firm* — Arent Fox LLP

(57) ABSTRACT

Techniques for integrating a machine-readable matrix with a component of a mechanical structure using three-dimensional (3-D) printing are disclosed. Such techniques include generating at least one data model representing the component, and projecting a matrix pattern identifying one or more features of the component onto a selected surface portion of the component to produce a modified data model for use as an input to a 3-D printer.

20 Claims, 12 Drawing Sheets

(51) Int. Cl.

| | |
|---|---|
| *B33Y 10/00* | (2015.01) |
| *G06K 1/12* | (2006.01) |
| *G06K 19/06* | (2006.01) |
| *B33Y 50/02* | (2015.01) |
| *G06T 7/73* | (2017.01) |
| *B29C 64/393* | (2017.01) |
| *B33Y 99/00* | (2015.01) |
| *G06F 17/00* | (2019.01) |
| *B33Y 50/00* | (2015.01) |
| *B29C 64/386* | (2017.01) |
| *B33Y 80/00* | (2015.01) |
| *G06F 30/17* | (2020.01) |
| *G06F 30/3323* | (2020.01) |
| *B29C 64/118* | (2017.01) |
| *B29C 64/153* | (2017.01) |
| *B29C 67/00* | (2017.01) |
| *B29C 69/00* | (2006.01) |

(52) U.S. Cl.
CPC .......... *B29C 64/386* (2017.08); *B29C 64/393* (2017.08); *B29C 67/0007* (2013.01); *B29C 69/001* (2013.01); *B33Y 50/00* (2014.12); *B33Y 80/00* (2014.12); *B33Y 99/00* (2014.12); *G06F 17/00* (2013.01); *G06F 30/17* (2020.01); *G06F 30/3323* (2020.01); *G06K 1/121* (2013.01); *G06K 1/123* (2013.01); *G06K 19/06028* (2013.01); *G06K 19/06037* (2013.01); *G06K 19/06159* (2013.01); *G06T 7/75* (2017.01); *B29C 2793/0009* (2013.01); *B29C 2793/009* (2013.01); *B29C 2795/007* (2013.01); *B29K 2995/002* (2013.01); *B29K 2995/0021* (2013.01); *G06K 2019/06271* (2013.01)

(58) Field of Classification Search
CPC ............ B29K 2995/0021; B33Y 10/00; B33Y 50/00; B33Y 50/02; G06K 1/12; G06K 1/121; G06K 1/123; G06K 19/06; G06K 19/06028; G06K 19/06037; G06K 19/06159; G06K 2019/06271
USPC ................ 264/129, 138, 245, 246, 308, 497; 219/121.6, 121.66, 121.85; 235/462.01, 235/462.04, 487, 490
See application file for complete search history.

(56) References Cited

U.S. PATENT DOCUMENTS

| | | |
|---|---|---|
| 5,990,444 A | 11/1999 | Costin |
| 6,010,155 A | 1/2000 | Rinehart |
| 6,096,249 A | 8/2000 | Yamaguchi |
| 6,140,602 A | 10/2000 | Costin |
| 6,250,533 B1 | 6/2001 | Otterbein et al. |
| 6,252,196 B1 | 6/2001 | Costin et al. |
| 6,318,642 B1 | 11/2001 | Goenka et al. |
| 6,365,057 B1 | 4/2002 | Whitehurst et al. |
| 6,391,251 B1 | 5/2002 | Keicher et al. |
| 6,409,930 B1 | 6/2002 | Whitehurst et al. |
| 6,468,439 B1 | 10/2002 | Whitehurst et al. |
| 6,554,345 B2 | 4/2003 | Jonsson |
| 6,585,151 B1 | 7/2003 | Ghosh |
| 6,644,721 B1 | 11/2003 | Miskech et al. |
| 6,811,744 B2 | 11/2004 | Keicher et al. |
| 6,866,497 B2 | 3/2005 | Saiki |
| 6,919,035 B1 | 7/2005 | Clough |
| 6,926,970 B2 | 8/2005 | James et al. |
| 7,152,292 B2 | 12/2006 | Hohmann et al. |
| 7,344,186 B1 | 3/2008 | Hausler et al. |
| 7,500,373 B2 | 3/2009 | Quell |
| 7,586,062 B2 | 9/2009 | Heberer |
| 7,637,134 B2 | 12/2009 | Burzlaff et al. |
| 7,710,347 B2 | 5/2010 | Gentilman et al. |
| 7,716,802 B2 | 5/2010 | Stern et al. |
| 7,745,293 B2 | 6/2010 | Yamazaki et al. |
| 7,766,123 B2 | 8/2010 | Sakurai et al. |
| 7,852,388 B2 | 12/2010 | Shimizu et al. |
| 7,908,922 B2 | 3/2011 | Zarabadi et al. |
| 7,951,324 B2 | 5/2011 | Naruse et al. |
| 8,094,036 B2 | 1/2012 | Heberer |
| 8,163,077 B2 | 4/2012 | Eron et al. |
| 8,286,236 B2 | 10/2012 | Jung et al. |
| 8,289,352 B2 | 10/2012 | Vartanian et al. |
| 8,297,096 B2 | 10/2012 | Mizumura et al. |
| 8,354,170 B1 | 1/2013 | Henry et al. |
| 8,383,028 B2 | 2/2013 | Lyons |
| 8,408,036 B2 | 4/2013 | Reith et al. |
| 8,429,754 B2 | 4/2013 | Jung et al. |
| 8,437,513 B1 | 5/2013 | Derakhshani et al. |
| 8,444,903 B2 | 5/2013 | Lyons et al. |
| 8,452,073 B2 | 5/2013 | Taminger et al. |
| 8,599,301 B2 | 12/2013 | Dowski, Jr. et al. |
| 8,606,540 B2 | 12/2013 | Haisty et al. |
| 8,610,761 B2 | 12/2013 | Haisty et al. |
| 8,631,996 B2 | 1/2014 | Quell et al. |
| 8,675,925 B2 | 3/2014 | Derakhshani et al. |
| 8,678,060 B2 | 3/2014 | Dietz et al. |
| 8,686,314 B2 | 4/2014 | Schneegans et al. |
| 8,686,997 B2 | 4/2014 | Radet et al. |
| 8,694,284 B2 | 4/2014 | Berard |
| 8,720,876 B2 | 5/2014 | Reith et al. |
| 8,752,166 B2 | 6/2014 | Jung et al. |
| 8,755,923 B2 | 6/2014 | Farahani et al. |
| 8,787,628 B1 | 7/2014 | Derakhshani et al. |
| 8,818,771 B2 | 8/2014 | Gielis et al. |
| 8,873,238 B2 | 10/2014 | Wilkins |
| 8,978,535 B2 | 3/2015 | Ortiz et al. |
| 9,006,605 B2 | 4/2015 | Schneegans et al. |
| 9,071,436 B2 | 6/2015 | Jung et al. |
| 9,101,979 B2 | 8/2015 | Hofmann et al. |
| 9,104,921 B2 | 8/2015 | Derakhshani et al. |
| 9,126,365 B1 | 9/2015 | Mark et al. |
| 9,128,476 B2 | 9/2015 | Jung et al. |
| 9,138,924 B2 | 9/2015 | Yen |
| 9,149,988 B2 | 10/2015 | Mark et al. |
| 9,156,205 B2 | 10/2015 | Mark et al. |
| 9,186,848 B2 | 11/2015 | Mark et al. |
| 9,244,986 B2 | 1/2016 | Karmarkar |
| 9,248,611 B2 | 2/2016 | Divine et al. |
| 9,254,535 B2 | 2/2016 | Buller et al. |
| 9,266,566 B2 | 2/2016 | Kim |
| 9,269,022 B2 | 2/2016 | Rhoads et al. |
| 9,327,452 B2 | 5/2016 | Mark et al. |
| 9,329,020 B1 | 5/2016 | Napoletano |
| 9,332,251 B2 | 5/2016 | Haisty et al. |
| 9,346,127 B2 | 5/2016 | Buller et al. |
| 9,389,315 B2 | 7/2016 | Bruder et al. |
| 9,399,256 B2 | 7/2016 | Buller et al. |
| 9,403,235 B2 | 8/2016 | Buller et al. |
| 9,418,193 B2 | 8/2016 | Dowski, Jr. et al. |
| 9,457,514 B2 | 10/2016 | Schwärzler |
| 9,469,057 B2 | 10/2016 | Johnson et al. |
| 9,478,063 B2 | 10/2016 | Rhoads et al. |
| 9,481,402 B1 | 11/2016 | Muto et al. |
| 9,486,878 B2 | 11/2016 | Buller et al. |
| 9,486,960 B2 | 11/2016 | Paschkewitz et al. |
| 9,502,993 B2 | 11/2016 | Deng |
| 9,525,262 B2 | 12/2016 | Stuart et al. |
| 9,533,526 B1 | 1/2017 | Nevins |
| 9,555,315 B2 | 1/2017 | Aders |
| 9,555,580 B1 | 1/2017 | Dykstra et al. |
| 9,557,856 B2 | 1/2017 | Send et al. |
| 9,566,742 B2 | 2/2017 | Keating et al. |
| 9,566,758 B2 | 2/2017 | Cheung et al. |
| 9,573,193 B2 | 2/2017 | Buller et al. |
| 9,573,225 B2 | 2/2017 | Buller et al. |
| 9,586,290 B2 | 3/2017 | Buller et al. |
| 9,595,795 B2 | 3/2017 | Lane et al. |
| 9,597,843 B2 | 3/2017 | Stauffer et al. |

(56) References Cited

U.S. PATENT DOCUMENTS

| | | |
|---|---|---|
| 9,600,929 B1 | 3/2017 | Young et al. |
| 9,609,755 B2 | 3/2017 | Coull et al. |
| 9,610,737 B2 | 4/2017 | Johnson et al. |
| 9,611,667 B2 | 4/2017 | GangaRao et al. |
| 9,616,623 B2 | 4/2017 | Johnson et al. |
| 9,626,487 B2 | 4/2017 | Jung et al. |
| 9,626,489 B2 | 4/2017 | Nilsson |
| 9,643,361 B2 | 5/2017 | Liu |
| 9,662,840 B1 | 5/2017 | Buller et al. |
| 9,665,182 B2 | 5/2017 | Send et al. |
| 9,672,389 B1 | 6/2017 | Mosterman et al. |
| 9,672,550 B2 | 6/2017 | Apsley et al. |
| 9,676,145 B2 | 6/2017 | Buller et al. |
| 9,684,919 B2 | 6/2017 | Apsley et al. |
| 9,688,032 B2 | 6/2017 | Kia et al. |
| 9,690,286 B2 | 6/2017 | Hovsepian et al. |
| 9,700,966 B2 | 7/2017 | Kraft et al. |
| 9,703,896 B2 | 7/2017 | Zhang et al. |
| 9,713,903 B2 | 7/2017 | Paschkewitz et al. |
| 9,718,302 B2 | 8/2017 | Young et al. |
| 9,718,434 B2 | 8/2017 | Hector, Jr. et al. |
| 9,724,877 B2 | 8/2017 | Flitsch et al. |
| 9,724,881 B2 | 8/2017 | Johnson et al. |
| 9,725,178 B2 | 8/2017 | Wang |
| 9,731,730 B2 | 8/2017 | Stiles |
| 9,731,773 B2 | 8/2017 | Gami et al. |
| 9,741,954 B2 | 8/2017 | Bruder et al. |
| 9,747,352 B2 | 8/2017 | Karmarkar |
| 9,764,415 B2 | 9/2017 | Seufzer et al. |
| 9,764,520 B2 | 9/2017 | Johnson et al. |
| 9,765,226 B2 | 9/2017 | Dain |
| 9,770,760 B2 | 9/2017 | Liu |
| 9,773,393 B2 | 9/2017 | Velez |
| 9,776,234 B2 | 10/2017 | Schaafhausen et al. |
| 9,782,936 B2 | 10/2017 | Glunz et al. |
| 9,783,324 B2 | 10/2017 | Embler et al. |
| 9,783,977 B2 | 10/2017 | Alqasimi et al. |
| 9,789,548 B2 | 10/2017 | Golshany et al. |
| 9,789,922 B2 | 10/2017 | Dosenbach et al. |
| 9,796,137 B2 | 10/2017 | Zhang et al. |
| 9,802,108 B2 | 10/2017 | Aders |
| 9,809,977 B2 | 11/2017 | Carney et al. |
| 9,817,922 B2 | 11/2017 | Glunz et al. |
| 9,818,071 B2 | 11/2017 | Jung et al. |
| 9,821,339 B2 | 11/2017 | Paschkewitz et al. |
| 9,821,411 B2 | 11/2017 | Buller et al. |
| 9,823,143 B2 | 11/2017 | Twelves, Jr. et al. |
| 9,829,564 B2 | 11/2017 | Bruder et al. |
| 9,846,933 B2 | 12/2017 | Yuksel |
| 9,854,828 B2 | 1/2018 | Langeland |
| 9,858,604 B2 | 1/2018 | Apsley et al. |
| 9,862,833 B2 | 1/2018 | Hasegawa et al. |
| 9,862,834 B2 | 1/2018 | Hasegawa et al. |
| 9,863,885 B2 | 1/2018 | Zaretski et al. |
| 9,870,629 B2 | 1/2018 | Cardno et al. |
| 9,879,981 B1 | 1/2018 | Dehghan Niri et al. |
| 9,884,663 B2 | 2/2018 | Czinger et al. |
| 9,898,776 B2 | 2/2018 | Apsley et al. |
| 9,914,150 B2 | 3/2018 | Pettersson et al. |
| 9,919,360 B2 | 3/2018 | Buller et al. |
| 9,931,697 B2 | 4/2018 | Levin et al. |
| 9,933,031 B2 | 4/2018 | Bracamonte et al. |
| 9,933,092 B2 | 4/2018 | Sindelar |
| 9,957,031 B2 | 5/2018 | Golshany et al. |
| 9,958,535 B2 | 5/2018 | Send et al. |
| 9,962,767 B2 | 5/2018 | Buller et al. |
| 9,963,978 B2 | 5/2018 | Johnson et al. |
| 9,971,920 B2 | 5/2018 | Derakhshani et al. |
| 9,976,063 B2 | 5/2018 | Childers et al. |
| 9,987,792 B2 | 6/2018 | Flitsch et al. |
| 9,988,136 B2 | 6/2018 | Tiryaki et al. |
| 9,989,623 B2 | 6/2018 | Send et al. |
| 9,990,565 B2 | 6/2018 | Rhoads et al. |
| 9,994,339 B2 | 6/2018 | Colson et al. |
| 9,996,890 B1 | 6/2018 | Cinnamon et al. |
| 9,996,945 B1 | 6/2018 | Holzer et al. |
| 10,002,215 B2 | 6/2018 | Dowski et al. |
| 10,006,156 B2 | 6/2018 | Kirkpatrick |
| 10,011,089 B2 | 7/2018 | Lyons et al. |
| 10,011,685 B2 | 7/2018 | Childers et al. |
| 10,012,532 B2 | 7/2018 | Send et al. |
| 10,013,777 B2 | 7/2018 | Mariampillai et al. |
| 10,015,908 B2 | 7/2018 | Williams et al. |
| 10,016,852 B2 | 7/2018 | Broda |
| 10,016,942 B2 | 7/2018 | Mark et al. |
| 10,017,384 B1 | 7/2018 | Greer et al. |
| 10,018,576 B2 | 7/2018 | Herbsommer et al. |
| 10,022,792 B2 | 7/2018 | Srivas et al. |
| 10,022,912 B2 | 7/2018 | Kia et al. |
| 10,027,376 B2 | 7/2018 | Sankaran et al. |
| 10,029,415 B2 | 7/2018 | Swanson et al. |
| 10,040,239 B2 | 8/2018 | Brown, Jr. |
| 10,046,412 B2 | 8/2018 | Blackmore |
| 10,048,769 B2 | 8/2018 | Selker et al. |
| 10,052,712 B2 | 8/2018 | Blackmore |
| 10,052,820 B2 | 8/2018 | Kemmer et al. |
| 10,055,536 B2 | 8/2018 | Maes et al. |
| 10,058,764 B2 | 8/2018 | Aders |
| 10,058,920 B2 | 8/2018 | Buller et al. |
| 10,061,906 B2 | 8/2018 | Nilsson |
| 10,065,270 B2 | 9/2018 | Buller et al. |
| 10,065,361 B2 | 9/2018 | Susnjara et al. |
| 10,065,367 B2 | 9/2018 | Brown, Jr. |
| 10,068,316 B1 | 9/2018 | Holzer et al. |
| 10,071,422 B2 | 9/2018 | Buller et al. |
| 10,071,525 B2 | 9/2018 | Susnjara et al. |
| 10,072,179 B2 | 9/2018 | Drijfhout |
| 10,074,128 B2 | 9/2018 | Colson et al. |
| 10,076,875 B2 | 9/2018 | Mark et al. |
| 10,076,876 B2 | 9/2018 | Mark et al. |
| 10,081,140 B2 | 9/2018 | Paesano et al. |
| 10,081,431 B2 | 9/2018 | Seack et al. |
| 10,086,568 B2 | 10/2018 | Snyder et al. |
| 10,087,320 B2 | 10/2018 | Simmons et al. |
| 10,087,556 B2 | 10/2018 | Gallucci et al. |
| 10,099,427 B2 | 10/2018 | Mark et al. |
| 10,100,542 B2 | 10/2018 | GangaRao et al. |
| 10,100,890 B2 | 10/2018 | Bracamonte et al. |
| 10,107,344 B2 | 10/2018 | Bracamonte et al. |
| 10,108,766 B2 | 10/2018 | Druckman et al. |
| 10,113,600 B2 | 10/2018 | Bracamonte et al. |
| 10,118,347 B2 | 11/2018 | Stauffer et al. |
| 10,118,579 B2 | 11/2018 | Lakic |
| 10,120,078 B2 | 11/2018 | Bruder et al. |
| 10,124,546 B2 | 11/2018 | Johnson et al. |
| 10,124,570 B2 | 11/2018 | Evans et al. |
| 10,137,500 B2 | 11/2018 | Blackmore |
| 10,138,354 B2 | 11/2018 | Groos et al. |
| 10,144,126 B2 | 12/2018 | Krohne et al. |
| 10,145,110 B2 | 12/2018 | Carney et al. |
| 10,151,363 B2 | 12/2018 | Bracamonte et al. |
| 10,152,661 B2 | 12/2018 | Kieser |
| 10,160,278 B2 | 12/2018 | Coombs et al. |
| 10,161,021 B2 | 12/2018 | Lin et al. |
| 10,166,752 B2 | 1/2019 | Evans et al. |
| 10,166,753 B2 | 1/2019 | Evans et al. |
| 10,171,578 B1 | 1/2019 | Cook et al. |
| 10,173,255 B2 | 1/2019 | TenHouten et al. |
| 10,173,327 B2 | 1/2019 | Kraft et al. |
| 10,178,800 B2 | 1/2019 | Mahalingam et al. |
| 10,179,640 B2 | 1/2019 | Wilkerson |
| 10,183,330 B2 | 1/2019 | Buller et al. |
| 10,183,478 B2 | 1/2019 | Evans et al. |
| 10,189,187 B2 | 1/2019 | Keating et al. |
| 10,189,240 B2 | 1/2019 | Evans et al. |
| 10,189,241 B2 | 1/2019 | Evans et al. |
| 10,189,242 B2 | 1/2019 | Evans et al. |
| 10,190,424 B2 | 1/2019 | Johnson et al. |
| 10,195,693 B2 | 2/2019 | Buller et al. |
| 10,196,539 B2 | 2/2019 | Boonen et al. |
| 10,197,338 B2 | 2/2019 | Melsheimer |
| 10,200,677 B2 | 2/2019 | Trevor et al. |
| 10,201,932 B2 | 2/2019 | Flitsch et al. |
| 10,201,941 B2 | 2/2019 | Evans et al. |

(56) References Cited

U.S. PATENT DOCUMENTS

| | | |
|---|---|---|
| 10,202,673 B2 | 2/2019 | Lin et al. |
| 10,204,216 B2 | 2/2019 | Nejati et al. |
| 10,207,454 B2 | 2/2019 | Buller et al. |
| 10,209,065 B2 | 2/2019 | Estevo, Jr. et al. |
| 10,210,662 B2 | 2/2019 | Holzer et al. |
| 10,213,837 B2 | 2/2019 | Kondoh |
| 10,214,248 B2 | 2/2019 | Hall et al. |
| 10,214,252 B2 | 2/2019 | Schellekens et al. |
| 10,214,275 B2 | 2/2019 | Goehlich |
| 10,220,575 B2 | 3/2019 | Reznar |
| 10,220,881 B2 | 3/2019 | Tyan et al. |
| 10,221,530 B2 | 3/2019 | Driskell et al. |
| 10,226,900 B1 | 3/2019 | Nevins |
| 10,232,550 B2 | 3/2019 | Evans et al. |
| 10,234,342 B2 | 3/2019 | Moorlag et al. |
| 10,237,477 B2 | 3/2019 | Trevor et al. |
| 10,252,335 B2 | 4/2019 | Buller et al. |
| 10,252,336 B2 | 4/2019 | Buller et al. |
| 10,254,499 B1 | 4/2019 | Cohen et al. |
| 10,257,499 B2 | 4/2019 | Hintz et al. |
| 10,259,044 B2 | 4/2019 | Buller et al. |
| 10,268,181 B1 | 4/2019 | Nevins |
| 10,269,225 B2 | 4/2019 | Velez |
| 10,272,860 B2 | 4/2019 | Mohapatra et al. |
| 10,272,862 B2 | 4/2019 | Whitehead |
| 10,275,564 B2 | 4/2019 | Ridgeway et al. |
| 10,279,580 B2 | 5/2019 | Evans et al. |
| 10,285,219 B2 | 5/2019 | Fetfatsidis et al. |
| 10,286,452 B2 | 5/2019 | Buller et al. |
| 10,286,603 B2 | 5/2019 | Buller et al. |
| 10,286,961 B2 | 5/2019 | Hillebrecht et al. |
| 10,289,263 B2 | 5/2019 | Troy et al. |
| 10,289,875 B2 | 5/2019 | Singh et al. |
| 10,291,193 B2 | 5/2019 | Dandu et al. |
| 10,294,552 B2 | 5/2019 | Liu et al. |
| 10,294,982 B2 | 5/2019 | Gabrys et al. |
| 10,295,989 B1 | 5/2019 | Nevins |
| 10,303,159 B2 | 5/2019 | Czinger et al. |
| 10,307,824 B2 | 6/2019 | Kondoh |
| 10,310,197 B1 | 6/2019 | Droz et al. |
| 10,313,651 B2 | 6/2019 | Trevor et al. |
| 10,315,252 B2 | 6/2019 | Mendelsberg et al. |
| 10,336,050 B2 | 7/2019 | Susnjara |
| 10,337,542 B2 | 7/2019 | Hesslewood et al. |
| 10,337,952 B2 | 7/2019 | Bosetti et al. |
| 10,339,266 B2 | 7/2019 | Urick et al. |
| 10,343,330 B2 | 7/2019 | Evans et al. |
| 10,343,331 B2 | 7/2019 | McCall et al. |
| 10,343,355 B2 | 7/2019 | Evans et al. |
| 10,343,724 B2 | 7/2019 | Polewarczyk et al. |
| 10,343,725 B2 | 7/2019 | Martin et al. |
| 10,350,823 B2 | 7/2019 | Rolland et al. |
| 10,356,341 B2 | 7/2019 | Holzer et al. |
| 10,356,395 B2 | 7/2019 | Holzer et al. |
| 10,357,829 B2 | 7/2019 | Spink et al. |
| 10,357,957 B2 | 7/2019 | Buller et al. |
| 10,359,756 B2 | 7/2019 | Newell et al. |
| 10,369,629 B2 | 8/2019 | Mendelsberg et al. |
| 10,382,739 B1 | 8/2019 | Rusu et al. |
| 10,384,393 B2 | 8/2019 | Xu et al. |
| 10,384,416 B2 | 8/2019 | Cheung et al. |
| 10,389,410 B2 | 8/2019 | Brooks et al. |
| 10,391,710 B2 | 8/2019 | Mondesir |
| 10,392,097 B2 | 8/2019 | Pham et al. |
| 10,392,131 B2 | 8/2019 | Deck et al. |
| 10,393,315 B2 | 8/2019 | Tyan |
| 10,400,080 B2 | 9/2019 | Ramakrishnan et al. |
| 10,401,832 B2 | 9/2019 | Snyder et al. |
| 10,403,009 B2 | 9/2019 | Mariampillai et al. |
| 10,406,750 B2 | 9/2019 | Barton et al. |
| 10,412,283 B2 | 9/2019 | Send et al. |
| 10,416,095 B2 | 9/2019 | Herbsommer et al. |
| 10,421,496 B2 | 9/2019 | Swayne et al. |
| 10,421,863 B2 | 9/2019 | Hasegawa et al. |
| 10,422,478 B2 | 9/2019 | Leachman et al. |
| 10,425,793 B2 | 9/2019 | Sankaran et al. |
| 10,427,364 B2 | 10/2019 | Alves |
| 10,429,006 B2 | 10/2019 | Tyan et al. |
| 10,434,573 B2 | 10/2019 | Buller et al. |
| 10,435,185 B2 | 10/2019 | Divine et al. |
| 10,435,773 B2 | 10/2019 | Liu et al. |
| 10,436,038 B2 | 10/2019 | Buhler et al. |
| 10,438,407 B2 | 10/2019 | Pavanaskar et al. |
| 10,440,351 B2 | 10/2019 | Holzer et al. |
| 10,442,002 B2 | 10/2019 | Benthien et al. |
| 10,442,003 B2 | 10/2019 | Symeonidis et al. |
| 10,449,696 B2 | 10/2019 | Elgar et al. |
| 10,449,737 B2 | 10/2019 | Johnson et al. |
| 10,461,810 B2 | 10/2019 | Cook et al. |
| 2006/0108783 A1 | 5/2006 | Ni et al. |
| 2007/0152032 A1 | 7/2007 | Tuschel |
| 2010/0055423 A1 | 3/2010 | Chretien |
| 2014/0263674 A1 | 9/2014 | Cerveny |
| 2014/0277669 A1 | 9/2014 | Nardi et al. |
| 2016/0260001 A1* | 9/2016 | Flores .............. G06K 19/06159 |
| 2017/0113344 A1 | 4/2017 | Schönberg |
| 2017/0341309 A1 | 11/2017 | Piepenbrock et al. |

FOREIGN PATENT DOCUMENTS

| | | |
|---|---|---|
| WO | 1996036525 A1 | 11/1996 |
| WO | 1996038260 A1 | 12/1996 |
| WO | 2003024641 A1 | 3/2003 |
| WO | 2004108343 A1 | 12/2004 |
| WO | 2005093773 A1 | 10/2005 |
| WO | 2007003375 A1 | 1/2007 |
| WO | 2007110235 A1 | 10/2007 |
| WO | 2007110236 A1 | 10/2007 |
| WO | 2008019847 A1 | 2/2008 |
| WO | 2007128586 A3 | 6/2008 |
| WO | 2008068314 A2 | 6/2008 |
| WO | 2008086994 A1 | 7/2008 |
| WO | 2008087024 A1 | 7/2008 |
| WO | 2008107130 A1 | 9/2008 |
| WO | 2008138503 A1 | 11/2008 |
| WO | 2008145396 A1 | 12/2008 |
| WO | 2009083609 A2 | 7/2009 |
| WO | 2009098285 A1 | 8/2009 |
| WO | 2009112520 A1 | 9/2009 |
| WO | 2009135938 A1 | 11/2009 |
| WO | 2009140977 A1 | 11/2009 |
| WO | 2010125057 A2 | 11/2010 |
| WO | 2010125058 A1 | 11/2010 |
| WO | 2010142703 A2 | 12/2010 |
| WO | 2011032533 A1 | 3/2011 |
| WO | 2014016437 A1 | 1/2014 |
| WO | 2014187720 A1 | 11/2014 |
| WO | 2014195340 A1 | 12/2014 |
| WO | 2015193331 A1 | 12/2015 |
| WO | 2016116414 A1 | 7/2016 |
| WO | 2017036461 A1 | 3/2017 |
| WO | 2019030248 A1 | 2/2019 |
| WO | 2019042504 A1 | 3/2019 |
| WO | 2019048010 A1 | 3/2019 |
| WO | 2019048498 A1 | 3/2019 |
| WO | 2019048680 A1 | 3/2019 |
| WO | 2019048682 A1 | 3/2019 |

* cited by examiner

METHODS FOR ADDITIVELY MANUFACTURED IDENTIFICATION FEATURES

CROSS-REFERENCE TO RELATED APPLICATIONS

This application is a divisional of, and claims priority to, U.S. patent application Ser. No. 15/677,734, filed Aug. 15, 2017, entitled "METHODS AND APPARATUS FOR ADDITIVELY MANUFACTURED IDENTIFICATION FEATURES," now U.S. Pat. No. 10,357,959 B2, which application is incorporated by reference in its entirety as if fully set forth herein.

BACKGROUND

Field

The present disclosure relates generally to data preservation techniques, and more specifically to integrated data matrices in additive manufacturing for facilitating the identification and preservation of data relevant to additively manufactured parts.

Background

Manufacturers in various industries have increasingly used additive manufacturing ("AM") as a means to produce more complex and cost-efficient components. AM systems, also described as three-dimensional (3-D) printers, can produce structures having geometrically complex shapes, including some shapes that are difficult or impossible to create with conventional manufacturing processes. While these AM capabilities have broad application, they are especially prevalent in industries involving vehicles, boats, aircraft, motorcycles, and other transport structures While producing components used in such structures, designers typically create a 3-D representation or model of the component using a computer-aided-design (CAD) program or similar application. The designer may create a custom representation of such a structure and/or use 3-D models from libraries of standard parts. Thereafter, the designed parts may be additively manufactured for further use or for assembly in a larger structure as appropriate.

During the course of these activities, designers and manufacturers in general have become aware of the importance of maintaining accurate records and data relating to each of the multitude of AM parts. To track such parts more efficiently, manufacturers often use barcodes or other identifiers affixed directly on the part. The barcode or other identifier may include information relative to one or more features of the item, such as its purpose, date and country of origin, intended destination, operating or assembly instructions, replacement date, instructions for assembly into a larger structure, and other pertinent details.

With the use of AM, however, new challenges have arisen in how to best associate these types of relevant data with AM components. Ordinary barcodes may be inadequate for this purpose. While the CAD model of the component is in 3-D, ordinary barcode data is in 2-D. This means that a 2-D data matrix representing the barcode is not compatible with a 3-D model of the corresponding AM product.

Conventional attempts to overcome this problem have included applying a separately printed barcode as a flat adhesive label onto the part. Among other deficiencies, this technique is both manually intensive and vulnerable to possible fraudulent activities such as label replacement and counterfeiting. Furthermore, such labels are ordinarily less durable than the associated AM component and are therefore particularly vulnerable to damage, vandalism, and tampering. These vulnerabilities erode confidence in the reliability of the manually applied label.

Accordingly, new techniques are needed for facilitating the association of relevant data with AM components.

SUMMARY

Several aspects of integrating data into AM components will be described more fully hereinafter with reference to three-dimensional printing techniques.

One aspect of a method of integrating a machine-readable matrix with a component of a mechanical structure using three-dimensional (3-D) printing includes generating at least one data model representing the component, and projecting a matrix pattern identifying one or more features of the component onto a selected surface portion of the component to produce a modified data model for use as an input to a 3-D printer.

One aspect of a component for use in a mechanical structure and three-dimensional (3-D) printed based on at least one data model includes a 3-D structure configured to perform one or more intended functions when assembled into the mechanical structure, and a machine-readable 3-D matrix pattern integrated on a selected surface portion of the 3-D structure and configured to identify one or more features of the component.

It will be understood that other aspects of integrating data into AM components will become readily apparent to those skilled in the art from the following detailed description, wherein it is shown and described only several embodiments by way of illustration. As will be realized by those skilled in the art, integrating data into AM components are capable of other and different embodiments and its several details are capable of modification in various other respects, all without departing from the invention. Accordingly, the drawings and detailed description are to be regarded as illustrative in nature and not as restrictive.

BRIEF DESCRIPTION OF THE DRAWINGS

Various aspects of integrating data into AM components will now be presented in the detailed description by way of example, and not by way of limitation, in the accompanying drawings, wherein.

DETAILED DESCRIPTION

The detailed description set forth below in connection with the appended drawings is intended to provide a description of various exemplary embodiments of integrating data into AM components and is not intended to represent the only embodiments in which the invention may be practiced. The term "exemplary" used throughout this disclosure means "serving as an example, instance, or illustration," and should not necessarily be construed as preferred or advantageous over other embodiments presented in this disclosure. The detailed description includes specific details for the purpose of providing a thorough and complete disclosure that fully conveys the scope of the invention to those skilled in the art. However, the invention may be practiced without these specific details. In some instances, well-known structures and components may be shown in block diagram form, or omitted entirely, in order to avoid obscuring the various concepts presented throughout this disclosure.

The use of 3-D printing in the context of composite tooling provides significant flexibility for enabling manufacturers of mechanical structures and mechanized assemblies to manufacture parts with complex geometries. For example, 3-D printing techniques provide manufacturers with the flexibility to design and build parts having intricate internal lattice structures and/or profiles that are not possible to manufacture via traditional manufacturing processes.

Figure 1:
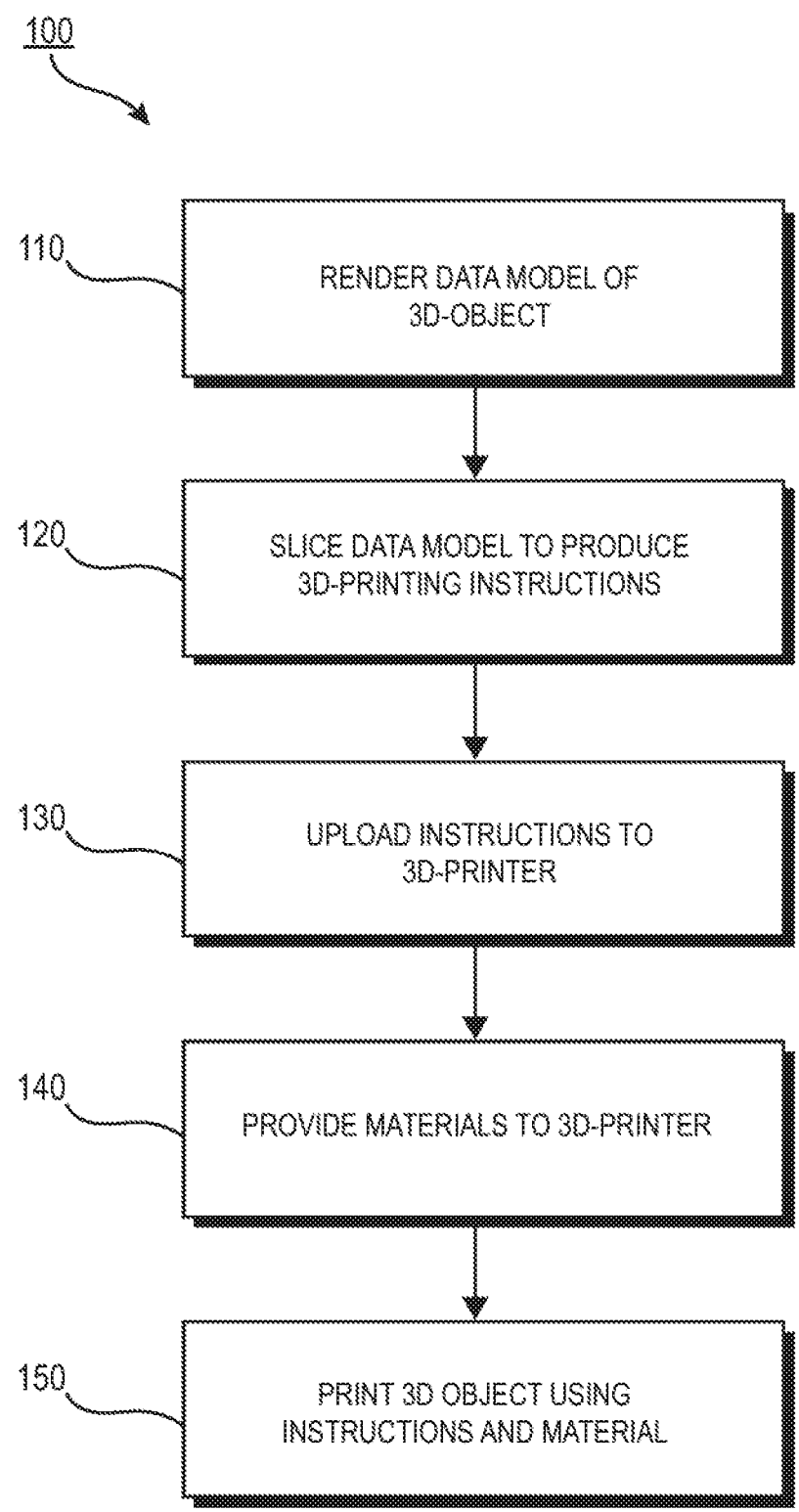
FIG. 1 is a flow diagram illustrating an exemplary process of initiating 3-D printing.

FIG. 1 is a flow diagram 100 illustrating an exemplary process of initiating an AM process. A data model of the desired 3-D object to be printed is rendered (step 110). A data model is a virtual design of the 3-D object. Thus, the data model may reflect the geometrical and structural features of the 3-D object, as well as its material composition. The data model may be created using a variety of methods, including 3D scanning, 3D modeling software, photogrammetry software, and camera imaging.

3D scanning methods for creating the data model may also use a variety of techniques for generating a 3-D model. These techniques may include, for example, time-of flight, volumetric scanning, structured light, modulated light, laser scanning, triangulation, and the like.

3-D modeling software, in turn, may include one of numerous commercially available 3-D modeling software applications. Data models may be rendered using a suitable computer-aided design (CAD) package, for example in an STL format. STL files are one example of a file format associated with commercially available CAD software. A CAD program may be used to create the data model of the 3-D object as an STL file. Thereupon, the STL file may undergo a process whereby errors in the file are identified and resolved.

Following error resolution, the data model can be "sliced" by a software application known as a slicer to thereby produce a set of instructions for 3-D printing the object, with the instructions being compatible and associated with the particular 3-D printing technology to be utilized (step 120). Numerous slicer programs are commercially available. Slicer programs convert the data model into a series of individual layers representing thin slices (e.g., 100 microns thick) of the object be printed, along with a file containing the printer-specific instructions for 3-D printing these successive individual layers to produce an actual 3-D printed representation of the data model.

A common type of file used for this purpose is a G-code file, which is a numerical control programming language that includes instructions for 3-D printing the object. The G-code file, or other file constituting the instructions, is uploaded to the 3-D printer (step 130). Because the file containing these instructions is typically configured to be operable with a specific 3-D printing process, it will be appreciated that many formats of the instruction file are possible depending on the 3-D printing technology used.

In addition to the printing instructions that dictate what and how an object is to be rendered, the appropriate physical materials necessary for use by the 3-D printer in rendering the object are loaded into the 3-D printer using any of several conventional and often printer-specific methods (step 140). Powder bed fusion (PBF), for example, is an AM technique that uses a laser or other power source, along with a deflector, to fuse powdered material by aiming the laser or power source automatically at points in space defined by a 3-D model and binding the material together to create a solid structure. PBF includes within its scope various specific types of AM methods. Selective laser melting (SLM) and selective laser sintering (SLS), for instance, are PBF techniques in which print materials may be loaded as powders into a powder bed defined by a build plate and bordering walls (see FIGS. 2A-D). Layers of powder are deposited in a controlled manner into the powder bed for the power source to selectively manipulate on a layer-by-layer basis. Depending on the type of 3-D printer, other techniques for loading printing materials may be used. For example, in fused deposition modelling (FDM) 3-D printers, materials are often loaded as filaments on spools, which are placed on one or more spool holders. The filaments are typically fed into an extruder apparatus which, in operation, heats the filament into a melted form before ejecting the material onto a build plate or other substrate.

Referring back to FIG. 1, the respective data slices of the 3-D object are then printed based on the provided instructions using the material(s) (step 150). In 3-D printers that use laser sintering, a laser scans a powder bed and melts the powder together where structure is desired, and avoids scanning areas where the sliced data indicates that nothing is to be printed. This process may be repeated thousands of times until the desired structure is formed, after which the printed part is removed from a fabricator. In fused deposition modelling, parts are printed by applying successive layers of model and support materials to a substrate. In general, any suitable 3-D printing technology may be employed for purposes of this disclosure.

FIGS. 2A-D illustrate respective side views of an exemplary PBF system 200 during different stages of operation. As noted above, the particular embodiment illustrated in FIGS. 2A-D is one of many suitable examples of a PBF system employing principles of this disclosure. It should also be noted that elements of FIGS. 2A-D and the other figures in this disclosure are not necessarily drawn to scale, but may be drawn larger or smaller for the purpose of better illustration of concepts described herein. PBF system 200 can include a depositor 201 that can deposit each layer of metal powder, an energy beam source 203 that can generate an energy beam, a deflector 205 that can apply the energy beam to fuse the powder, and a build plate 207 that can support one or more build pieces, such as a build piece 209. PBF system 200 can also include a build floor 211 positioned within a powder bed receptacle. The walls of the powder bed receptacle 212 generally define the boundaries of the powder bed receptacle, which is sandwiched between the walls 212 from the side and abuts a portion of the build floor 211 below. Build floor 211 can progressively lower build plate 207 so that depositor 201 can deposit a next layer. The entire mechanism may reside in a chamber 213 that can enclose the other components, thereby protecting the equipment, enabling atmospheric and temperature regulation and mitigating contamination risks. Depositor 201 can include a hopper 215 that contains a powder 217, such as a metal powder, and a leveler 219 that can level the top of each layer of deposited powder.

Figure 2A:
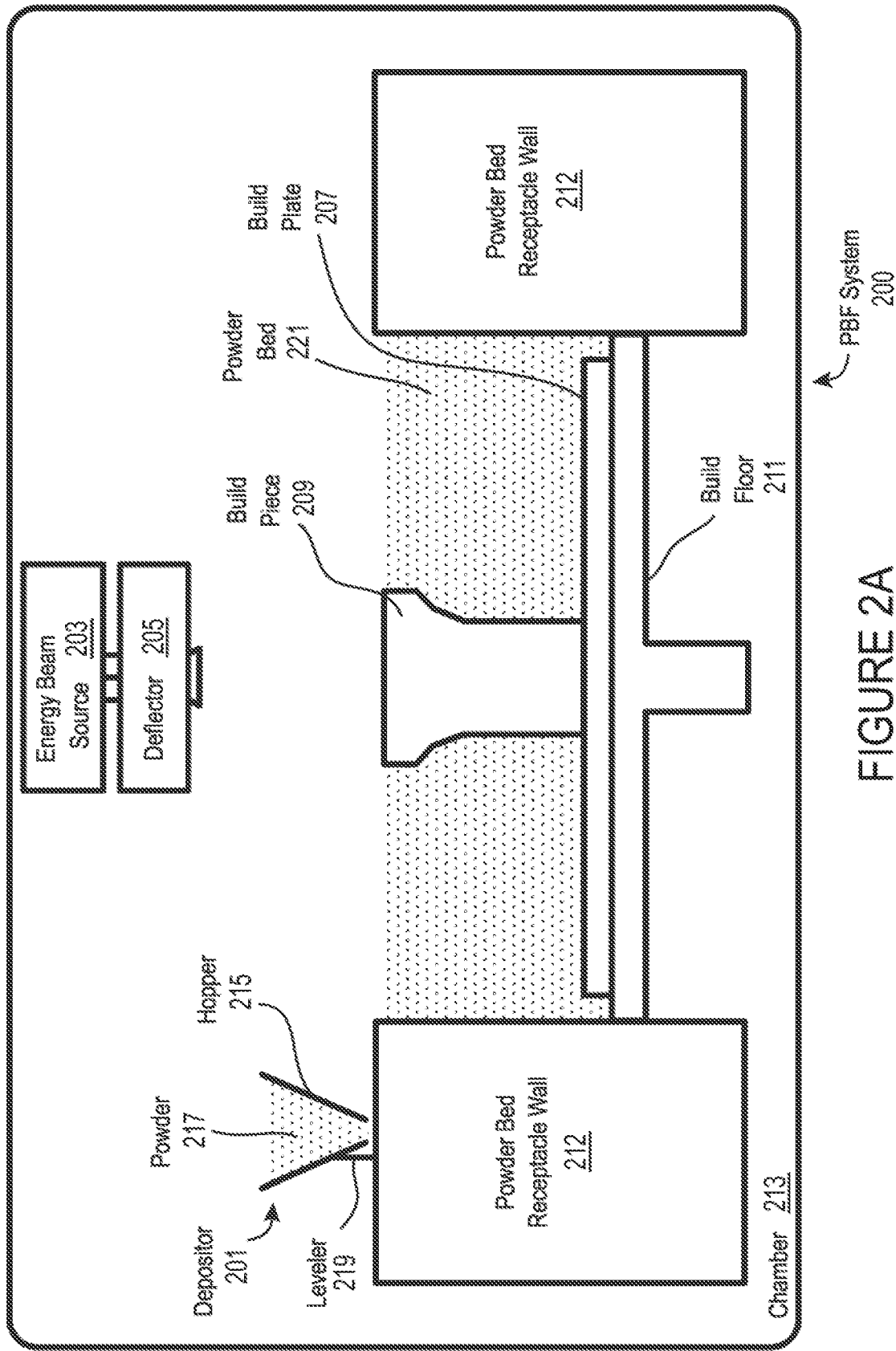
FIGS. 2A-D illustrate an exemplary powder bed fusion (PBF) system during different stages of operation.

Referring specifically to FIG. 2A, this figure shows PBF system 200 after a slice of build piece 209 has been fused, but before the next layer of powder has been deposited. In fact, FIG. 2A illustrates a time at which PBF system 200 has already deposited and fused slices in multiple layers, e.g., 150 layers, to form the current state of build piece 209, e.g., formed of 150 slices. The multiple layers already deposited have created a powder bed 221, which includes powder that was deposited but not fused.

Figure 2B:
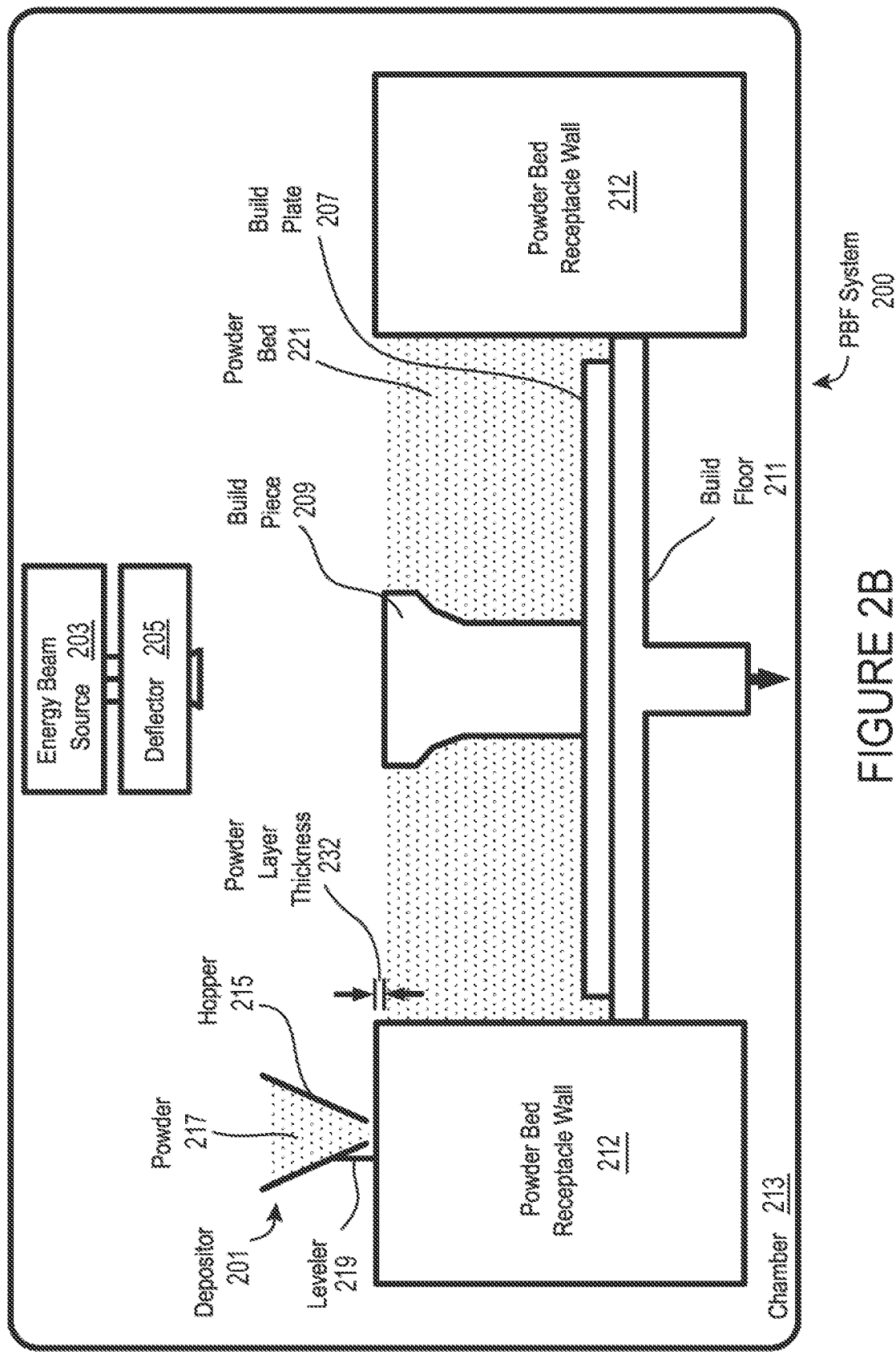

FIG. 2B shows PBF system 200 at a stage in which build floor 211 can lower by a powder layer thickness 232. The lowering of build floor 211 causes build piece 209 and powder bed 221 to drop by powder layer thickness 232, so that the top of the build piece and powder bed are lower than the top of powder bed receptacle wall 212 by an amount equal to the powder layer thickness. In this way, for example, a space with a consistent thickness equal to powder layer thickness 232 can be created over the tops of build piece 209 and powder bed 221.

Figure 2C:
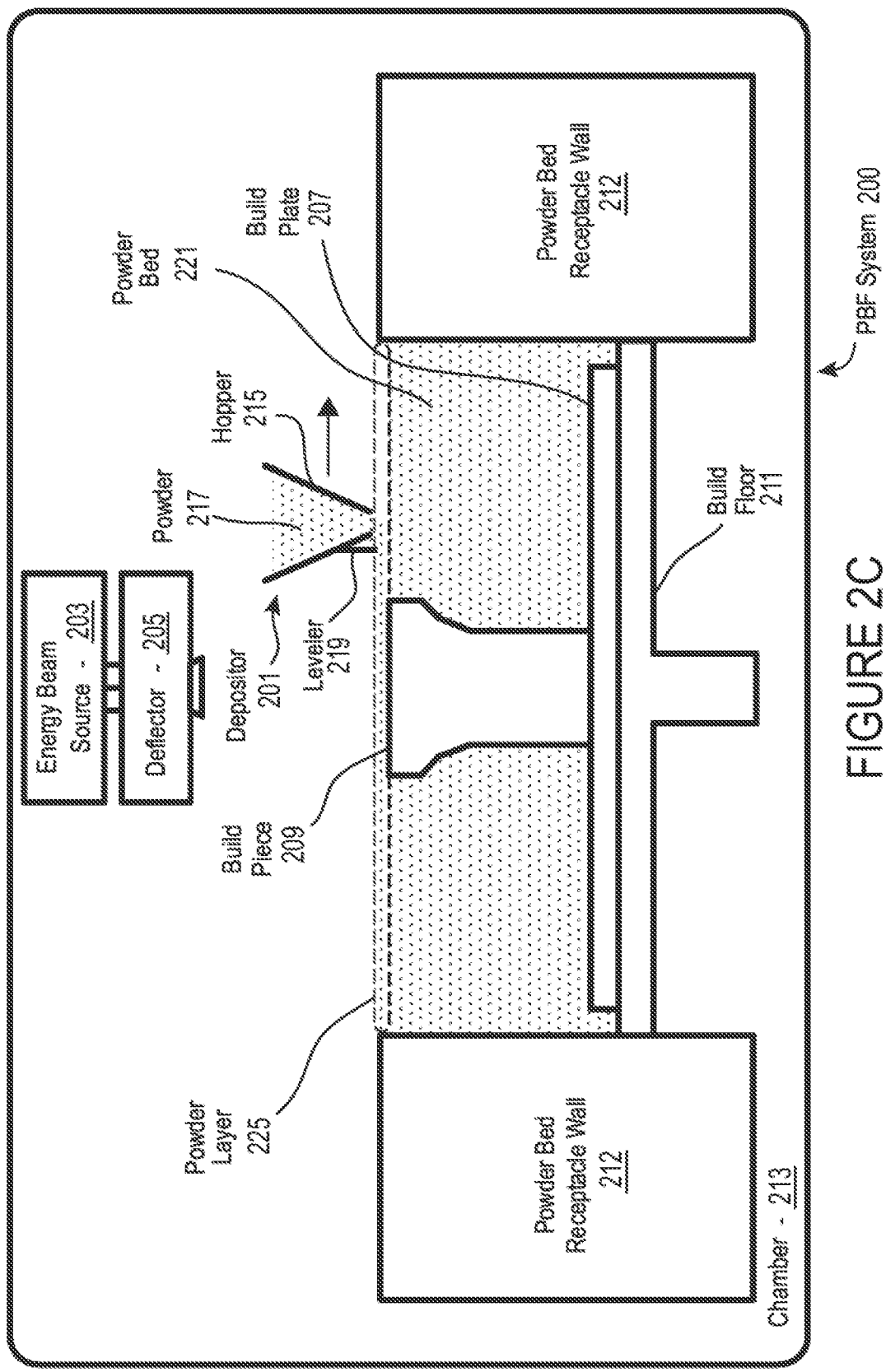

FIG. 2C shows PBF system 200 at a stage in which depositor 201 is positioned to deposit powder 217 in a space created over the top surfaces of build piece 209 and powder bed 221 and bounded by powder bed receptacle walls 212. In this example, depositor 201 progressively moves over the defined space while releasing powder 217 from hopper 215. Leveler 219 can level the released powder to form a powder layer 225 that has a thickness substantially equal to the powder layer thickness 232 (see FIG. 2B). Thus, the powder in a PBF system can be supported by a powder support structure, which can include, for example, a build plate 207, a build floor 211, a build piece 209, walls 212, and the like. It should be noted that the illustrated thickness of powder layer 225 (i.e., powder layer thickness 232 (FIG. 2B)) is greater than an actual thickness used for the example involving 150 previously-deposited layers discussed above with reference to FIG. 2A.

Figure 2D:
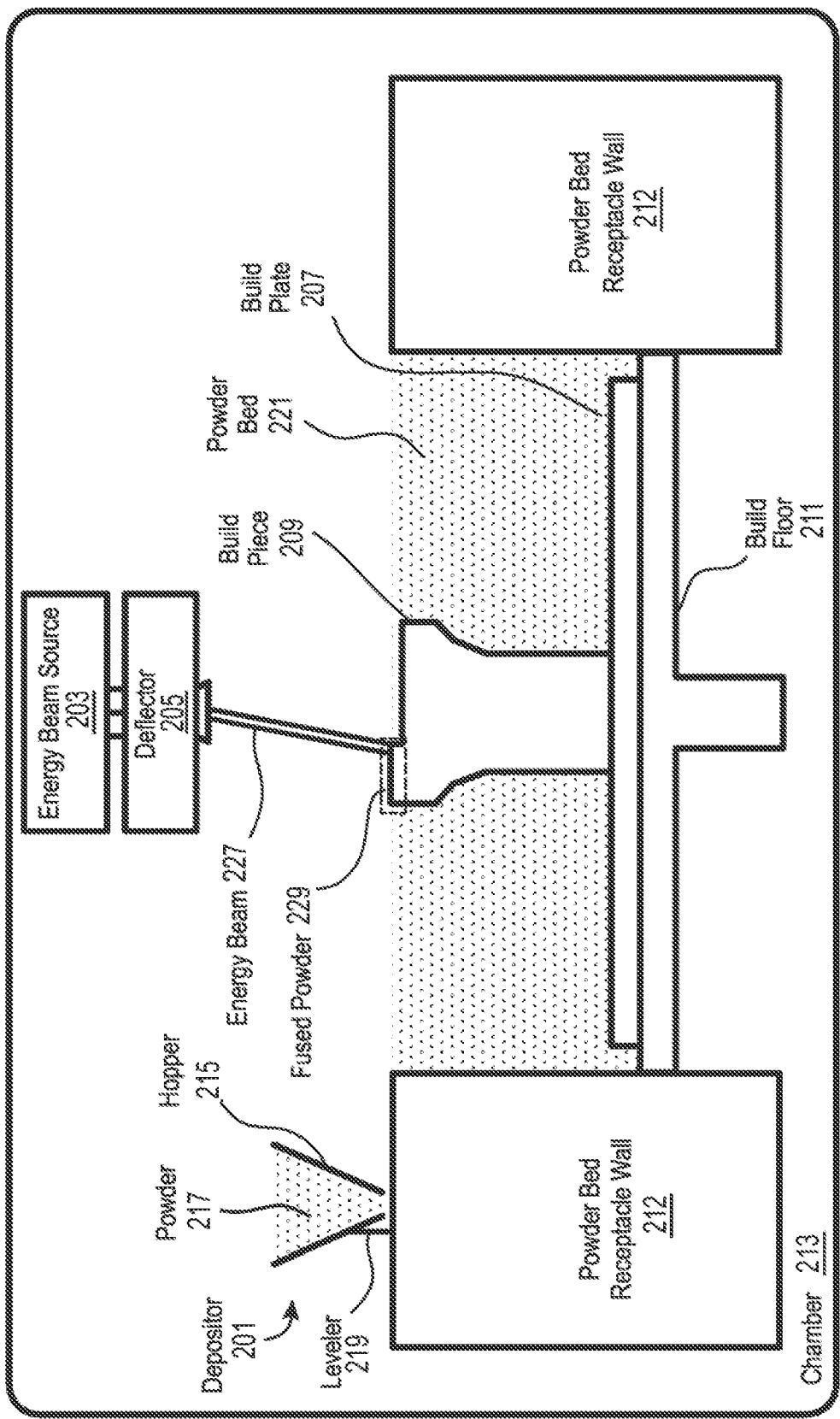

FIG. 2D shows PBF system 200 at a stage in which, following the deposition of powder layer 225 (FIG. 2C), energy beam source 203 generates an energy beam 227 and deflector 205 applies the energy beam to fuse the next slice in build piece 209. In various exemplary embodiments, energy beam source 203 can be an electron beam source, in which case energy beam 227 constitutes an electron beam. Deflector 205 can include deflection plates that can generate an electric field or a magnetic field that selectively deflects the electron beam to cause the electron beam to scan across areas designated to be fused. In various embodiments, energy beam source 203 can be a laser, in which case energy beam 227 is a laser beam. Deflector 205 can include an optical system that uses reflection and/or refraction to manipulate the laser beam to scan selected areas to be fused.

In various embodiments, the deflector 205 can include one or more gimbals and actuators that can rotate and/or translate the energy beam source to position the energy beam. In various embodiments, energy beam source 203 and/or deflector 205 can modulate the energy beam, e.g., turn the energy beam on and off as the deflector scans so that the energy beam is applied only in the appropriate areas of the powder layer. For example, in various embodiments, the energy beam can be modulated by a digital signal processor (DSP).

As noted above, parts that are additively manufactured are typically designed as part of a 3-D data model. By contrast, typical data matrices are a mathematical model of a flat, two-dimensional, binary black-and-white surface pattern similar to a printed paper label. These properties make such a data representation incompatible for integration into AM components. To avoid such incompatibilities and the conventional deficiencies discussed above with respect to conventional solutions, the method herein broadly contemplates directly associating the matrix permanently into the AM part in an immutable way.

Figure 3A:
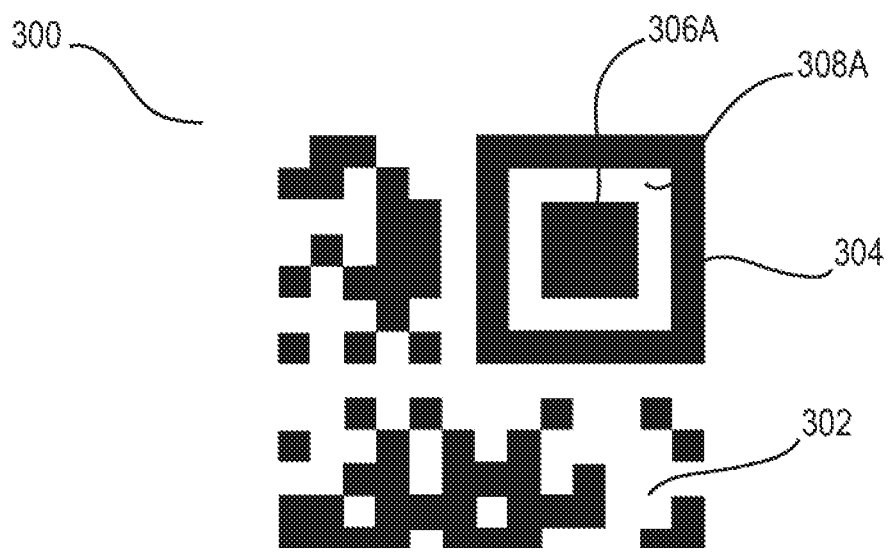
FIG. 3A is an example of a 2-D matrix code.

FIG. 3A is an example of a 2-D matrix code 300. Matrix codes are symbols that require regions with high contrast relative to one another, such as light zones 302 and dark zones 304, to enable good legibility. Conventionally, good legibility has been attained by printing black ink onto a light-colored label, a process that generally yields a strong contrast. This conventional approach involves a two-step process to first produce the label—namely, make the paper tab and mark it accordingly—and second to attach the label to the component. Process deviations in design and manufacturing, and in field use including the malicious influences described above, can introduce unpredictable errors or result in tampering activities.

Figure 3B:
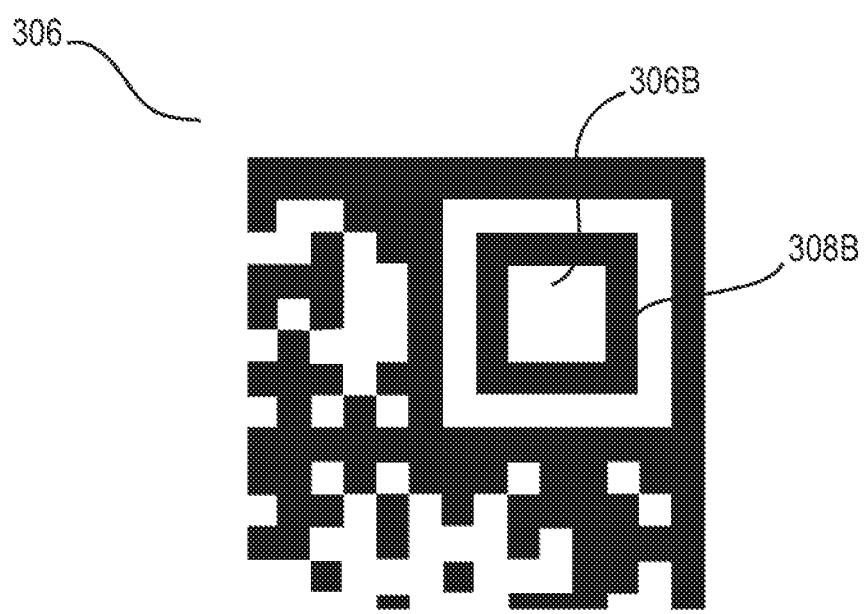
FIG. 3B is an example of a 2-D matrix code having a different polarity and that contains identical data to matrix code of FIG. 3A.

FIG. 3B is an example of a 2-D matrix code 306 that contains identical data to matrix code 300 of FIG. 3A. The matrices 300 and 306 have the same pattern and internal shapes, but differ with respect to their bright-dark polarity. For example, shapes 306A and 306B are the same but with dark inverted to light and vice versa. Similarly, shapes 308A and 308B are the same but with light inverted to dark and vice versa. This general polarity reversal pattern persists throughout matrices 300 and 306. The matrix polarity is not relevant to the reader in the sense that both polarities may be interpreted to read as the same data text. In short, information is conveyed in these labels because the dark and light zones in the matrices 300 and 306 create contrast when viewed by a barcode reader. This information may be included in the location of the light-dark transitions.

In one aspect of the disclosure, a 3-D machine-readable data matrix integrated into an AM component is disclosed. In an embodiment, the techniques as described herein integrate the steps described above with reference to FIGS. 3A-B into a single AM step and permanently integrate the data matrix into the shape of the original AM component. In the initial design process, a 3-D matrix pattern may be integrated into a part. This is accomplished by projecting a 2-D pattern of the matrix into 3-D space and onto the plane of an identified surface of a 3-D data model. Using this technique, the matrix pattern can be translated and rotated to be rendered consistent with the part's relevant surface facet. In an embodiment, a part may be scaled in order to accommodate a relatively flat facet area for this purpose.

Figure 4A:
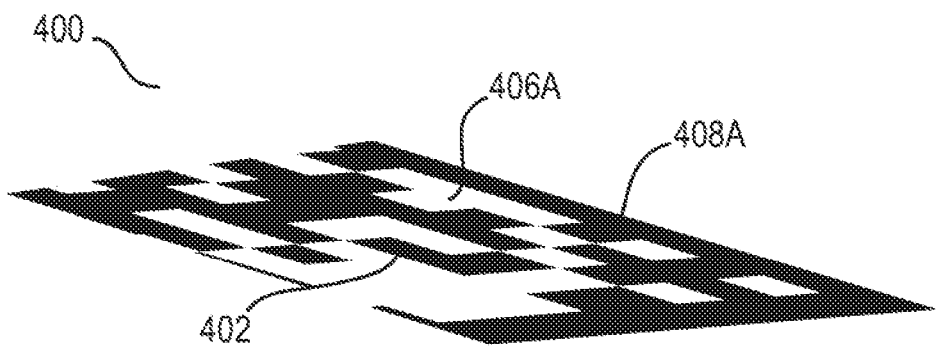
FIG. 4A shows an AM matrix projected to a 3-D surface facet in accordance with an aspect of the present disclosure.

FIG. 4A shows a 2-D AM matrix 400 projected onto a 3-D surface facet in accordance with an embodiment. The 2-D matrix 400 is shown segmented into black and white zones 402. However, it will be appreciated that colors may in some instances not be realizable or available during the AM process. The projection of FIG. 4A may be accomplished by selecting a desirable flat surface facet area on the 3-D component to be additively manufactured and projecting the matrix pattern onto the surface facet of the 3-D model.

In an embodiment, the particular location on the part is selected for its visibility and accessibility, whether with the part in isolation or with the part as assembled into its operating position within a larger structure, such as a vehicle. This facet selection may involve tradeoffs or design compromises. For example, the part as designed may not have a suitable surface facet. In this case, the part may in some instances be redesigned to incorporate a flat area to accommodate this feature. Further, while there may be accessible and visible flat surface facets for the isolated part, the part as assembled into a larger structure may not have any accessible such surface facets. Accordingly, in some embodiments, various design changes may be considered and implemented in order to facilitate a view of the matrix on the part. In short, changes may be required to present a suitably visible surface facet to act as a machine-readable label or nameplate on a moving part. These and other aspects may be taken into consideration during the design phase of the AM process.

In one embodiment, the matrices generated may be compatible with all reader types, including a barcode type reader, LED and laser illumination readers, ambient techniques, lens-based imaging, scanning, and the like.

Figure 4B:
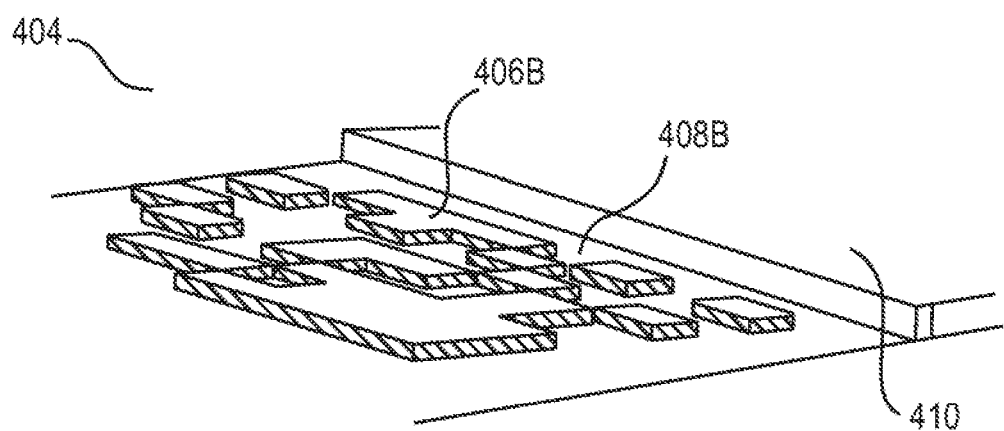
FIG. 4B shows a 2-D matrix projected onto a relatively flat surface facet of the 3-D model through translation, scaling, and rotation.

FIG. 4B shows a 2-D matrix 404 projected onto a relatively flat surface facet of the 3-D model through translation, scaling, and rotation. After these steps, the projected matrix has been elevated such that regions corresponding to light zones 406A (FIG. 4A) have been elevated as shown by region 406B (FIG. 4B) and may be 3-D printed at the part surface 410. Conversely, regions corresponding to dark zones 408A (FIG. 4A) may be inset as shown by region 408B (FIG. 4B) into the part surface 410. In an embodiment, readable contrast may be created using any one or more of three techniques. First, a surface texture differential may be generated to reflect illumination differently (see FIGS. 8-11). Second, shadows may be generated in areas of varying elevation using differential block illumination. For this technique, elevations above and below the surface may cast shadows that darken certain areas such that, for example, upper surfaces may be illuminated and appear bright, while lower surfaces may be shadowed and appear dark. Vertical wall surfaces may be obscured by relatively sharp normal reading angles relative to the surface of the projected matrix. Third, coloration or infill such as paint may be used as a post-processing step.

As is evident from matrix 404 of FIG. 4B, the dark zones 408B of the matrix pattern may be projected downward vertically to form a prismatic indentation below the part surface. This effect forms a relieved 3-D representation of the matrix into the surface of the data model. The resulting matrix 404 may resemble a carving on the part surface. Inset dark zones 408B may create shadows that produce matrix contrast. Light zones 406B may remain elevated at surface level and may cast shadows into the dark zones 408B. This shadowing effect exploits the offset between the illuminator and the sensor, which offset may vary but in some embodiments may be approximately 15-45 degrees. In general, at larger illumination offsets and deeper inset distances, this shadowing effect may create readable contrast.

Figure 5:
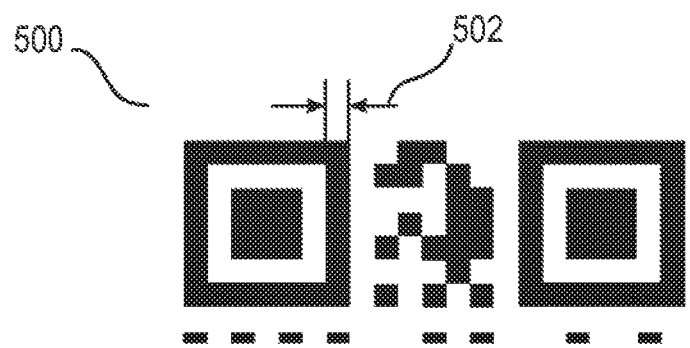
FIG. 5 is an example of a code pitch dimension as measured on the 2-D matrix of FIG. 3A.

FIG. 5 is an example of a code pitch dimension 502 as measured on the 2-D matrix 500 of FIG. 3A. Code pitch dimension 502 is defined as the smallest discrete unit on the matrix. Code pitch dimension 502 determines the spatial resolution of the encoded information in the matrix. This dimension generally sets the limit of standoff distance and readability for barcode readers and camera sensors that can read the data in the matrix 500.

Figure 6:
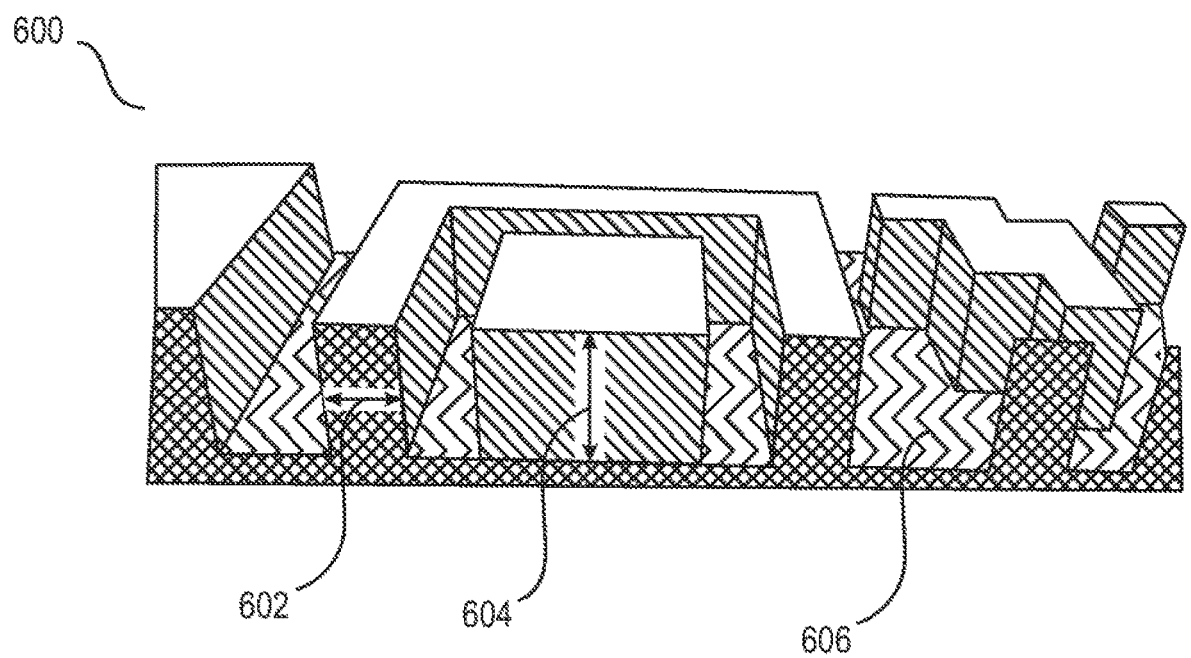
FIG. 6 is a cross-sectional view of an extruded 3-D printed matrix made integral to an AM component.

FIG. 6 is a cross-sectional view of an extruded 3-D printed matrix 600 made integral to an AM component. Code pitch dimension CP (602) is represented in this embodiment by a cross-sectional width of the smallest feature in the matrix. FIG. 6 also shows relief depth dimension RDD (604), which defines the well depth to which the matrix pattern may be inset below the AM component surface. In this exemplary embodiment, the relief depth dimension is two code-pitch lengths such that RDD=2×CP. Thus, in one embodiment, the inset below the AM part surface may be set such that the relief depth dimension is twice the code pitch. It will be appreciated that this quantity is illustrative in nature, and other dimensions may be equally suitable.

While a native matrix material may be selected and used during the component's AM process to form the readable matrix pattern, this pattern may not provide an optical contrast between the matrix and base 606. That is, because these homogenous zones exhibit no contrast between dark and light areas, the matrix may not be readable to a sensor or barcode reader. For example, in the cases of black-on-black or white-on-white marking, the low contrast may not be visible. Thus, in accordance with another aspect of the disclosure, contrast-enhancing features may be incorporated into the component data model and integrated with the AM process of the component.

Figure 7:
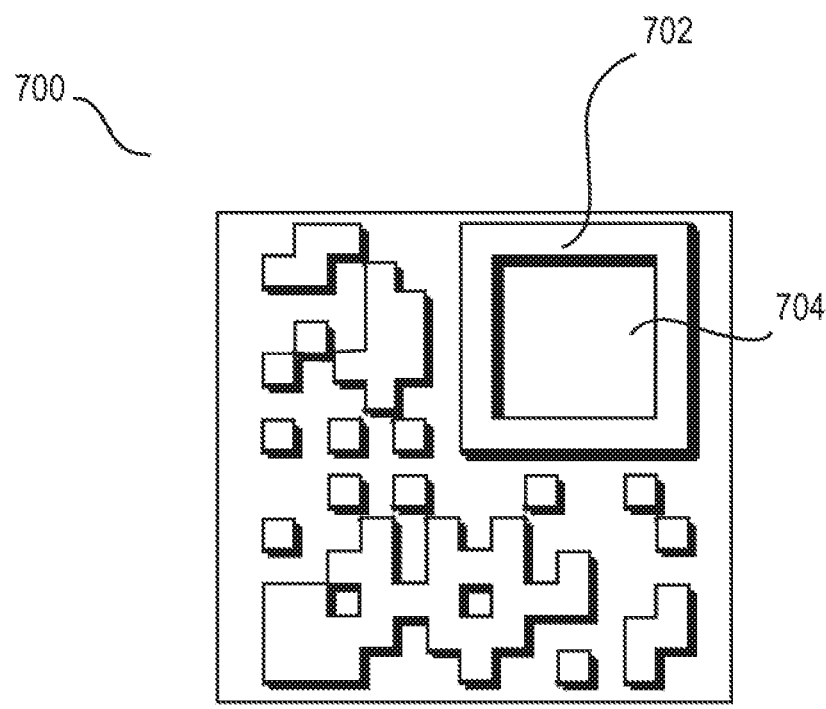
FIG. 7 is a sensor view of an extruded 3-D matrix 700 with a flat top upper surface.

FIG. 7 is a sensor view of an extruded 3-D matrix 700 with a flat top upper surface. The matrix 700 includes light zone 702 and dark zone 704 and has a similar pattern as the matrix of FIG. 3A. In this example, the matrix pattern 700 has been formed into the homogenous material of the subject component. Dark zone 306A of FIG. 3A corresponds to dark zone 704 in FIG. 7. Similarly, light zone 308A of FIG. 3A corresponds to light zone 702 in FIG. 7. The apparent contrast between dark and light zones relative to a sensor viewing the matrix at an angle substantially orthogonal to the matrix surface may be poor, having been lost as a side-effect of the AM process. Thus, in this instance, it may be difficult or impossible for a reader to reliably find the matrix or to read the data content encoded therein.

In one embodiment, a more deeply inset pattern may be used to recover some of the lost resolution. In another embodiment, in cases where the AM component is not capable of providing a deeper pattern or where such a pattern is otherwise impractical, dark and light areas may be programmed having different textures. In an exemplary embodiment, a surface texturing contrast creation mechanism is employed. Contrast may be created, for example, through differential texturing incorporated into the surface of the AM matrix. The texture may interfere with the illumination either constructively or destructively as described hereinafter, thereby creating dark and light zones.

Figure 8:
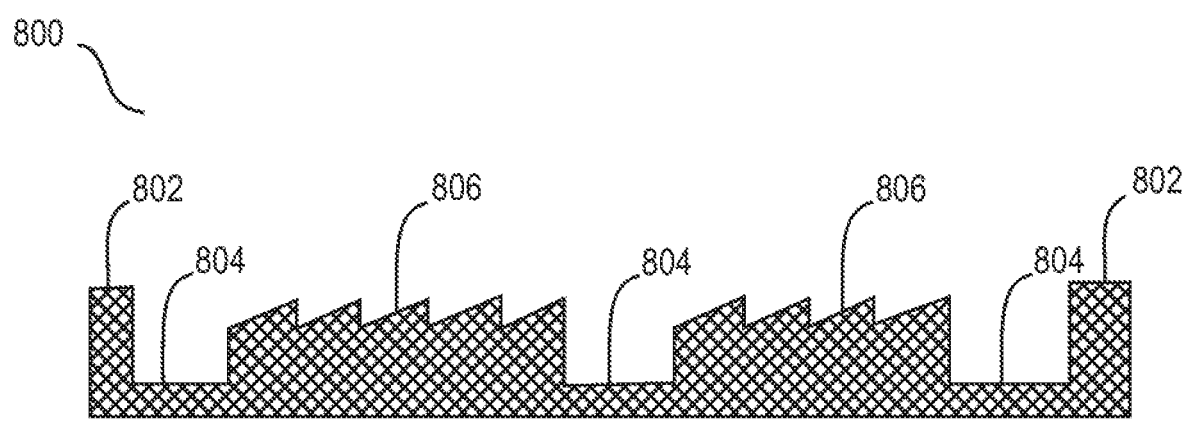
FIG. 8 is a cross-sectional view of a 3-D printed matrix having varying surface textures.

FIG. 8 is a cross-sectional view of a 3-D printed matrix 800 having varying surface textures. In this embodiment, dark and light areas may be programmed with different textures. The surface finish and textured topography of a textured matrix may interact with illumination of a reader to produce a strong contrast and a reliable, readable matrix symbology pattern. The matrix 800 may include a part surface 802, a specular well zone 804, and a textured zone 806. The part surface 802 may be planar or relatively flat. If no matrix were printed, the part surface 802 would extend uniformly flat across the top of the figure. In this example, the matrix 800 is formed entirely by eliminating material below the part surface 802. However, in other embodiments, matrices can also be formed at the part surface 802 or elevated and protruding above the part surface 802. Recession below the surface to well zones 804 may be advantageous in some instances because the indented shape of textured zones 806 may provide protection of the matrix symbols and patterns against frictional wear and tear and other trauma.

The textured zones 806 may reflect light at different angles than the more indented well zones 804. This effect may be enhanced at certain viewing angles as a result of the obscuration and shadowing caused by matrix recession. The relieved geometry of the matrix 800 and its textures may be arranged to create visible contrast under most lighting conditions with both structured and ambient light. Effective contrast may therefore be achieved under a variety of common viewing conditions and the matrix reading process may be made more reliable as a result.

Figure 9:
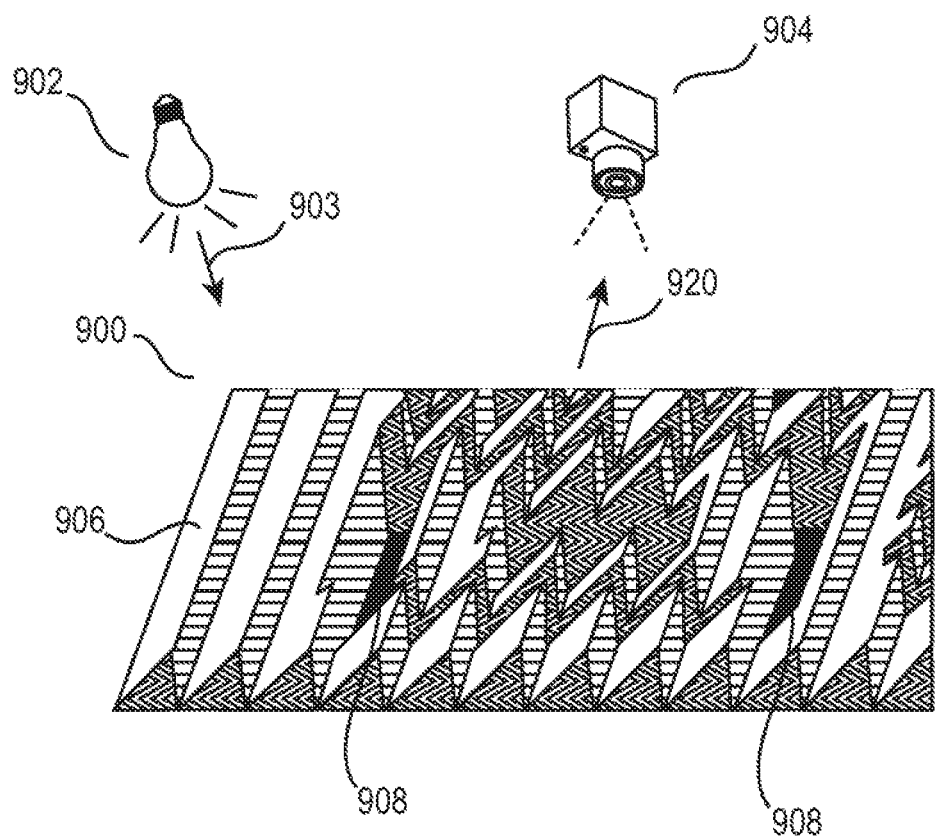
FIG. 9 shows an illustration of a code-reading operation of a textured matrix in accordance with the present disclosure.

FIG. 9 shows a code-reading operation of a textured matrix 900 in accordance with the present disclosure. An illumination source 902 may generate light 903 that is directed onto the AM component and corresponding matrix 900. The matrix 900 may include a plurality of canted ridges 906 and recessed wells 908. The light 902 may be reflected differentially off canted ridges 906 and recessed wells 908. The reflected light 920 may thereupon be scattered differentially by the two textures and respective elevations. This scattering may create a contrasting pattern between the light and dark zones of the matrix 900.

The pattern of reflected light and dark areas constituting the matrix symbology may be received by sensor 904. Thereupon, an image of the matrix pattern may be formed in the sensor and processed to extract its symbolic content and geometric metadata including, for example, 3-D position, 3-D orientation, etc.

Figures 10A, 10B, 10C:
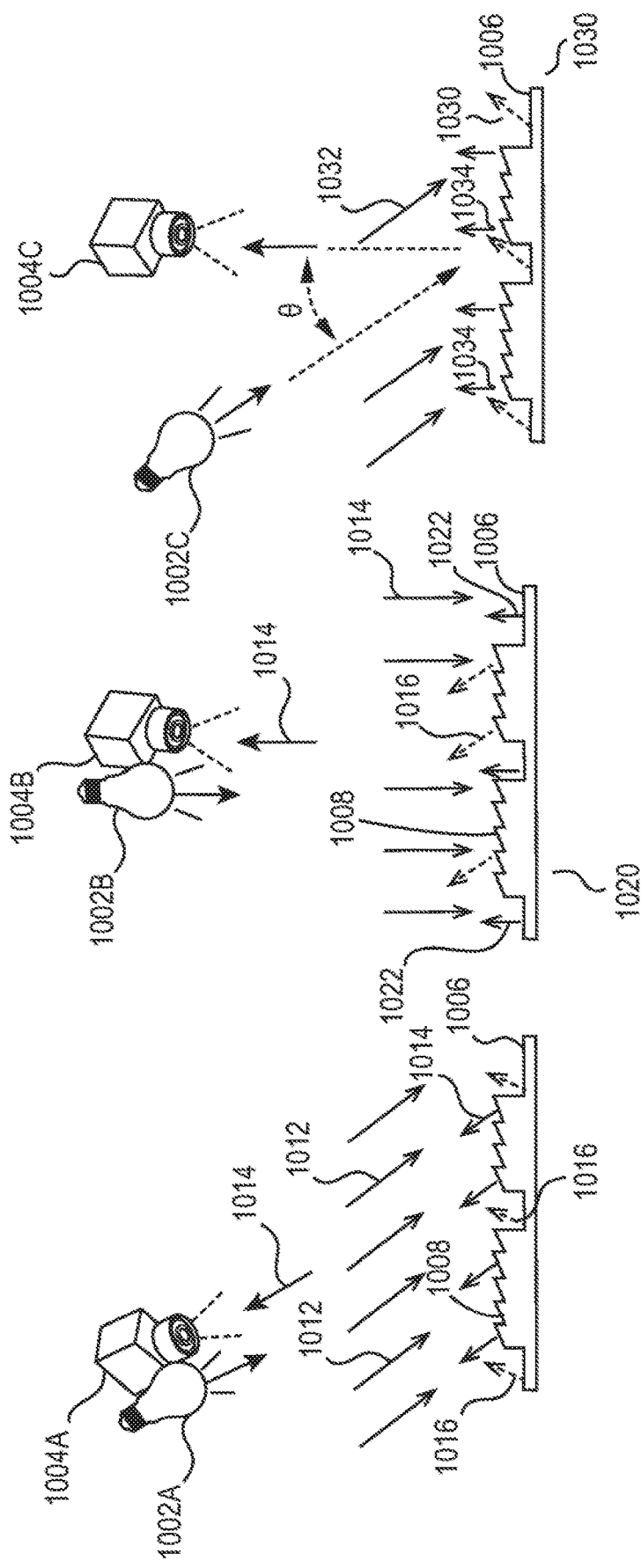
FIGS. 10A-C show an illustration of variations of the matrix code reading process from three perspectives.

FIGS. 10A-C show an illustration of variations of the matrix code reading process from three perspectives. FIGS. 10A-C show illuminators 1002A-C and sensors 1004A-C, respectively. Referring initially to the example of FIG. 10A, matrix 1010 includes textured surfaces 1008 and specular well zones 1006. As shown, sensor 1004A is at an offset viewing angle relative to matrix 1010 and illuminator 1002A is on axis with sensor 1004A such that illuminator 1002A directs light to matrix 1010 at substantially the same angle as sensor 1004A receives it. The sensor 1004A and illuminator 1002A are in a nearly coaxial position and the field of illumination is nearly coincident with the field of view of sensor 1004A. Thus, because the light 1012 is coincident with textured surfaces 1008, reflected light 1014 from textured surfaces 1008 is bright and specular well zones 1006 are dark, which may correspond to a normal polarity.

More specifically, as illuminator 1002A emits light 1012, the textured surface 1008 of matrix 1010 may reflect light 1014 from bright zones into the sensor 1004A and the specular well zones 1006 may deflect light 1016 in a different direction. A readable contrast is thereby achieved.

Referring to FIG. 10B, sensor 1004B is at a normal (orthogonal) viewing angle relative to matrix 1020 and illumination of light 1014 from illuminator 1002B is on axis with sensor 1004B. Thus, because the direction of light 1014 is normal to specular well zones 1006 rather than the textured surfaces 1008, the textured surfaces 1008 in this embodiment are dark, the specular well zones 1006 are bright, and the polarity is inverted. Here, light 1022 from the specular well zones 1006 may be reflected directly back to sensor 1004B. The dashed lines 1016 represent the angle of any illumination differentially reflected from dark textured surfaces 1008, which is advantageously different from the angle at which light 1022 is reflected from bright specular well zones 1006. A good readable contrast may be achieved in this example as well.

Referring to FIG. 10C, sensor 1004C is at a normal viewing angle relative to specular matrix 1030 and specular well zones 1006. Illuminator 1002C is off-axis relative to sensor 1004C by an angle θ. In this example, light 1032 from illuminator 1002C arrives at angle θ substantially coincident with textured surfaces 1008. The textured surfaces 1008 consequently may reflect light 1034 directly toward the viewing angle of sensor 1004. By contrast, light 1030 reflected from the specular wells 1006 may be differentially reflected away from a viewing angle of sensor 1004C. Thus, in this embodiment, textured surfaces 1008 are bright, specular wells 1006 are dark and the polarity is normal. A good readable contrast may be achieved in this situation.

In another aspect of the disclosure, a technique for reducing contamination exposure in 3-D integrated matrices is disclosed. In addition to creating visible contrast, matrix recession such as in the embodiment of FIGS. 10A-C may improve resistance to contamination. Contamination of surfaces may be common, for example, in outdoor environments where the part may be exposed to dirt, grease, road dust and the like. Accumulated contamination may potentially obscure or interfere with the operation of sensors 1004A-C or other devices that may be used read the matrix symbology.

Figure 11:
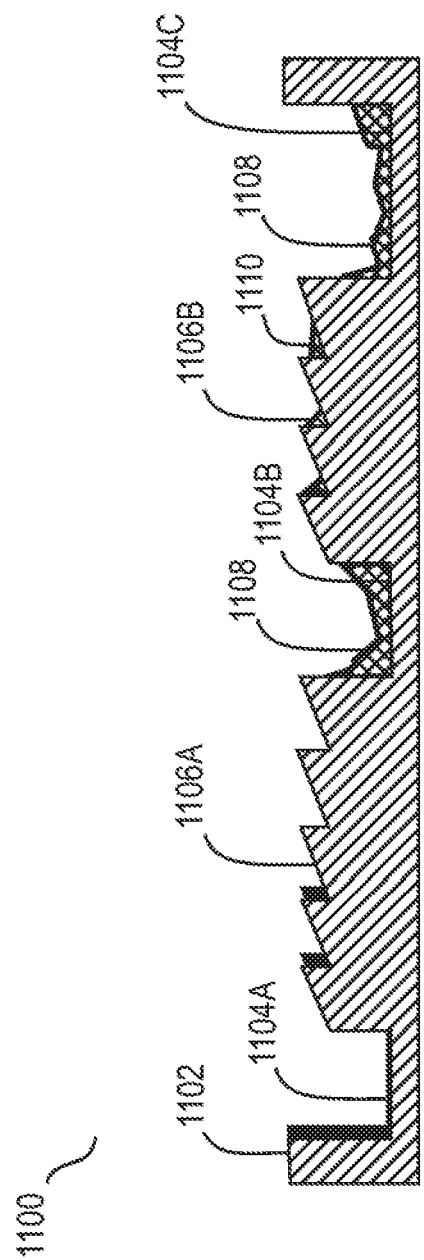
FIG. 11 shows a cross section of a matrix that has been exposed to contamination.

FIG. 11 shows a cross section of a matrix 1100 that has been exposed to contamination. The matrix includes component surface 1100, well zones 1104A-C, and textured zones 1106A-B. As is evident from the illustration, well zones 1104A-C and textured zones 1106A-B have indentations where contaminants may accumulate. Two of the well zones 1104B-C have been exposed to a contaminant 1108. Similarly, one of the textured zones 1106b has been exposed to a contaminant 1110. The contaminating substance may include, for example, substances like dirt, grease, mud, or other fine granular foreign substances. The contaminating substance may further include some mixture of organic and inorganic materials.

As is further evident from the illustration, one of well zones 1104A and one of textured zones 1106A are free from contamination. Well zone 1104A is deeper than the indentations in textured zones 1106A-B. Further, well zone 1104C is wider than the indentations in textured zones 1106A-B. For these reasons, well zones 1104A and 1104C may be able to sustain a greater accumulated bulk of contaminated material before becoming corrupted. Similarly, well zones 1104A and 1104C may also accommodate larger particles with larger overall grain size. Because the identified well zones are deeper and/or wider, the bulk of contamination may therefore accumulate in the well zones 1104A and 1104C and not in the textured surfaces 1106A-B.

Particulate matter generally scatters light broadly, as opposed to the relatively flat and smooth specular surfaces of the AM component. The small amount of contaminated material 1110 captured in textured surface 1106B may therefore be relatively insignificant. This feature provides an inherent difference in optical characteristics of the relative surfaces, which in turn may translate to a strong contrast between the light and dark zones. To this end, accumulated contamination may actually reinforce and improve the readability of the matrix symbology produced according to these embodiments. This optical feature further reinforces immunity to contamination and therefore overall reliability of the integrated matrix.

The previous description is provided to enable any person skilled in the art to practice the various aspects described herein. Various modifications to these exemplary embodiments presented throughout this disclosure will be readily apparent to those skilled in the art, and the concepts disclosed herein may be applied to other techniques for integrating 3-D matrices into parts. Thus, the claims are not intended to be limited to the exemplary embodiments presented throughout the disclosure, but are to be accorded the full scope consistent with the language claims. All structural and functional equivalents to the elements of the exemplary embodiments described throughout this disclosure that are known or later come to be known to those of ordinary skill in the art are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), or analogous law in applicable jurisdictions, unless the element is expressly recited using the phrase "means for" or, in the case of a method claim, the element is recited using the phrase "step for."

What is claimed is:

1. A method of integrating a machine-readable matrix with a component of a mechanical structure using three-dimensional (3-D) printing, comprising:
    generating at least one data model representing the component; and
    projecting a matrix pattern identifying one or more features of the component onto a selected surface portion of the component to produce a modified data model for use as an input to a 3-D printer, wherein projecting the matrix pattern comprises integrating a 3-D matrix pattern into the selected surface to produce the modified data model, and wherein integrating the 3-D matrix pattern into the selected surface comprises selectively eliminating material below the selected surface to form the 3-D matrix pattern.

2. The method of claim 1, further comprising 3-D printing the component including the projected matrix pattern using the modified data model.

3. The method of claim 1, wherein the projecting the matrix pattern comprises at least one of translating, scaling, and rotating the matrix pattern relative to the selected surface portion.

4. The method of claim 1, wherein the projecting the matrix pattern comprises converting a two-dimensional (2-D) matrix pattern into a 3-D matrix pattern on the selected surface portion.

5. The method of claim 1, further comprising adding a plurality of surface textures to the matrix pattern.

6. The method of claim 1, further comprising varying an elevation of selected portions of the matrix pattern to create a machine-readable contrast.

7. The method of claim 6, wherein at least one elevated portion appears brighter to a machine reader and at least one portion lower than the at least one elevated portion appears darker to the machine reader to thereby create the machine-readable contrast.

8. The method of claim 1, further comprising adding coloration to the matrix pattern.

9. The method of claim 1, further comprising adding an infill to the matrix pattern.

10. The method of claim 1, further comprising 3-D printing the component using the modified data model.

11. A method of integrating a machine-readable matrix with a component of a mechanical structure using three-dimensional (3-D) printing, comprising:
    generating at least one data model representing the component; and
    projecting a matrix pattern identifying one or more features of the component onto a selected surface portion of the component to produce a modified data model for use as an input to a 3-D printer, wherein projecting the matrix pattern comprises integrating a 3-D matrix pattern into the selected surface to produce the modified data model, and integrating the 3-D matrix pattern into the selected surface comprises selectively adding material above the selected surface portion to form the 3-D matrix pattern.

12. The method of claim 11, further comprising 3-D printing the component including the projected matrix pattern using the modified data model.

13. The method of claim 11, wherein the projecting the matrix pattern comprises at least one of translating, scaling, and rotating the matrix pattern relative to the selected surface portion.

14. The method of claim 11, wherein the projecting the matrix pattern comprises converting a two-dimensional (2-D) matrix pattern into a 3-D matrix pattern on the selected surface portion.

15. The method of claim 11, further comprising adding a plurality of surface textures to the matrix pattern.

16. The method of claim 11, further comprising varying an elevation of selected portions of the matrix pattern to create a machine-readable contrast.

17. The method of claim 16, wherein at least one elevated portion appears brighter to a machine reader and at least one portion lower than the at least one elevated portion appears darker to the machine reader to thereby create the machine-readable contrast.

18. The method of claim 11, further comprising adding coloration to the matrix pattern.

19. The method of claim 11, further comprising adding an infill to the matrix pattern.

20. The method of claim 11, further comprising 3-D printing the component using the modified data model.

* * * * *